United States Patent
Igarashi et al.

(10) Patent No.: US 6,779,710 B2
(45) Date of Patent: Aug. 24, 2004

(54) MOUNTING PARTS PEEL SUPPRESSING SOLDERING METHOD, ELECTRONIC CIRCUIT BASEBOARD, AND ELECTRONIC INSTRUMENT

(75) Inventors: Minoru Igarashi, Kanagawa-ken (JP); Katsuhiko Mukai, Kanagawa-ken (JP); Masashi Isoda, Kanagawa-ken (JP); Takayuki Kobayashi, Kanagawa-ken (JP)

(73) Assignee: Ricoh Company, Ltd., Kanagawa-Ken (JP)

( * ) Notice: Subject to any disclaimer, the term of this patent is extended or adjusted under 35 U.S.C. 154(b) by 0 days.

(21) Appl. No.: 10/133,479

(22) Filed: Apr. 29, 2002

(65) Prior Publication Data
US 2002/0170947 A1 Nov. 21, 2002

(30) Foreign Application Priority Data
Apr. 27, 2001 (JP) .................................. 2001-132295

(51) Int. Cl.$^7$ .............................................. B23K 31/02
(52) U.S. Cl. .................... 228/180.1; 228/225; 228/230; 228/260
(58) Field of Search .................................. 228/230, 260, 228/37, 234.1, 180.1, 180.21, 180.22, 245, 246, 248.1, 225, 226, 227, 229

(56) References Cited

U.S. PATENT DOCUMENTS

| | | | | |
|---|---|---|---|---|
| 4,515,304 A | * | 5/1985 | Berger | 228/136 |
| 4,573,105 A | * | 2/1986 | Beldavs | 361/768 |
| 4,600,137 A | * | 7/1986 | Comerford | 228/102 |
| 4,761,881 A | * | 8/1988 | Bora et al. | 29/840 |
| 5,155,904 A | * | 10/1992 | Majd | 29/837 |
| 5,320,274 A | * | 6/1994 | Precious et al. | 228/37 |
| 5,527,628 A | * | 6/1996 | Anderson et al. | 428/647 |
| 5,737,834 A | * | 4/1998 | Sabotke et al. | 29/840 |
| 6,045,032 A | * | 4/2000 | Longgood et al. | |
| 6,095,403 A | * | 8/2000 | Akin et al. | 228/180.1 |
| 6,116,497 A | * | 9/2000 | Scheel et al. | 228/234.2 |
| 6,231,691 B1 | * | 5/2001 | Anderson et al. | 148/400 |
| 6,340,110 B1 | * | 1/2002 | Nakamura et al. | 228/179.1 |
| 6,347,732 B1 | * | 2/2002 | Akin et al. | 228/9 |
| 6,464,122 B1 | * | 10/2002 | Tadauchi et al. | 228/1.1 |
| 2002/0011511 A1 | * | 1/2002 | Takahashi et al. | |
| 2002/0130163 A1 | * | 9/2002 | Miyazawa | |
| 2002/0170947 A1 | * | 11/2002 | Igarashi et al. | |
| 2003/0034381 A1 | * | 2/2003 | Nakatsuka et al. | |

FOREIGN PATENT DOCUMENTS

EP 0568087 A2 * 11/1993
JP 409139570 A * 5/1997

OTHER PUBLICATIONS

Translation of JP–409139570A.*

* cited by examiner

Primary Examiner—Kiley Stoner
(74) Attorney, Agent, or Firm—Dickstein Shapiro Morin & Oshinsky LLP

(57) ABSTRACT

A method for soldering parts mounted on a print circuit baseboard with Pb-free material. A reflow soldering process is performed to parts mounted on one side surface of the print circuit baseboard. A flow soldering process is then performed to parts mounted on the other side surface of the print circuit baseboard with a jet flow solder process. Either a composition or a melting point of alloys generated when the reflow and flow soldering are performed is differentiated so that the alloy on one side surface does not melt during a flow soldering process to the other side surface.

18 Claims, 18 Drawing Sheets

FIG. 4A1
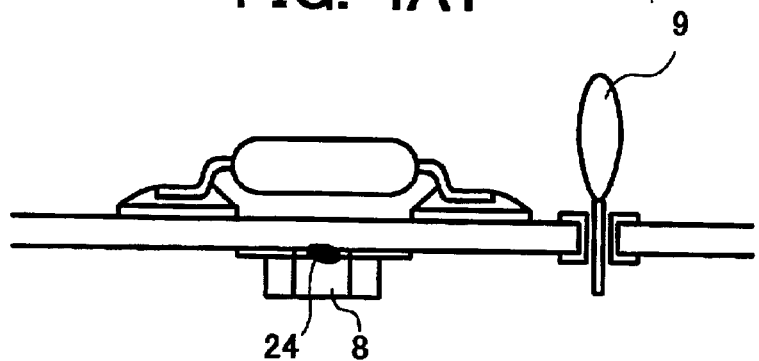
FIG. 4A2
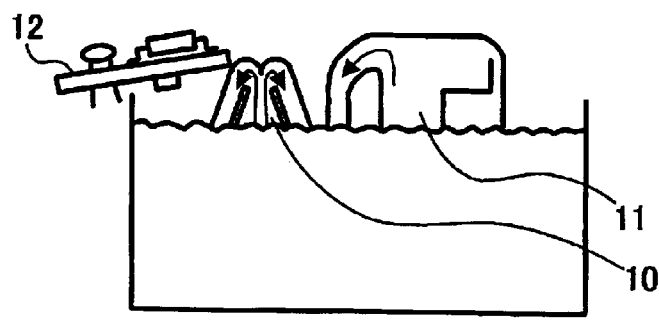
FIG. 4B
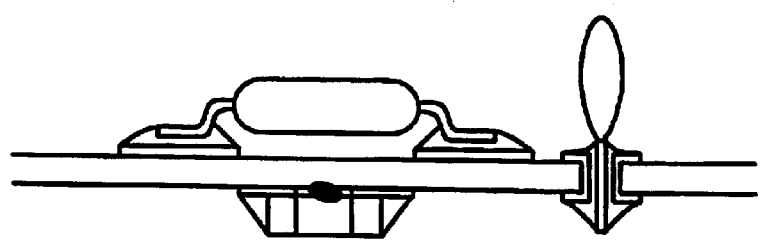

FIG. 23A

| FIG. 23 | FIG. 23A |
|---|---|
| | FIG. 23B |
| | FIG. 23C |

| CHARACTERISTIC ITEM / METAL ALLOY TYPE | MELTING POINT | MACHINE PROPERTY | WETTING PERFORMANCE | OXIDATION PERFORMANCE | PROCESSING PERFORMANCE | COST | CHARACTERISTICS |
|---|---|---|---|---|---|---|---|
| Sn-Ag SERIES (Sn-Ag-Cu SERIES, Bi-NONE) | △ | ◎ | △ | ○ | ○ | △ | THIS IS MOTHER BODY METAL ALLOY HAVING LONG ACTUAL CREDENTIAL AS HIGH TEMPERATURE SOLDER AND EXCELLENT MACHINE PERFORMANCE, CAPABLE OF COVERING A PERFORMANCE WITH APPENDAGE. |
| Sn-Ag SERIES (Sn-Ag-Cu-SMALL AMOUNT OF Bi) | △ | ○ | ○ | ○ | △ | △ | THIS IS THE MOST EXCELLENTLY BALANCED SERIES BUT, PROCESSING AND EXPANSION TO STRING SOLDER ARE DIFFICULT. |

FIG. 23B

| | | | | | | | |
|---|---|---|---|---|---|---|---|
| Sn-Ag SERIES (Sn-Ag-Cu-SLIGHTLY LARGE AMOUNT OF -Bi) | ○ | △ | ○ | ○ | △ | △ | BASED UPON INCREASE IN A "Bi" AMOUNT, THERE IS A PROBLEM IN A TOTAL MACHINE PERFORMANCE. |
| Sn-Cu SERIES | △ | ◎ | △ | ○ | ○ | ○ | THIS IS AN EXCELLENT METAL ALLOY SERIES IN VIEW OF COST & MACHINE PROPERTY. BUT, ITS HIGH MELTING POINT IS A PROBLEM. |
| Sn-Zn SERIES | ◎ | ○ | △ | △ | △ | ○ | ITS MELTING POINT IS BOUNDLESSLY CLOSE TO THAT OF A Sn-Pb CRYSTAL, AND ATTRACTIVE. BUT, IT HAS A HEAVY DEFECT DUE TO ITS OXIDATION PERFORMANCE. |

FIG. 24A

| | FIG. 24A |
|---|---|
| FIG. 24 | FIG. 24B |

| METAL ALLOY SERIES | COMPO-SITION (wt%) | SOLID PHASE LINE TEMPER-ATURE(°C) | LIQUID PHASE LINE TEMPER-ATURE(°C) | JIS SYMBOL |
|---|---|---|---|---|
| Sn-Pb SERIES | Sn-5Pb | 183 | 224 | H95A,B H65S |
| | Sn-35Pb | 183 | 186 | |
| | Sn-37Pb | 183 | 184 | H63S,A,B |
| | Sn-40Pb | 183 | 190 | H60S,A,B |
| | Sn-45Pb | 183 | 203 | H55S,A,B |
| | Sn-50Pb | 183 | 215 | H50S,A,B |
| Pb-Sn SERIES | Sn-55Pb | 183 | 227 | H45S,A,B |
| | Sn-60Pb | 183 | 238 | H40S,A,B |
| | Sn-65Pb | 183 | 248 | H35A,B |
| | Sn-70Pb | 183 | 258 | H30A,B |
| | Sn-80Pb | 183 | 279 | H20A,B |
| | Sn-90Pb | 268 | 301 | H10A,B |
| | Sn-95Pb | 300 | 314 | H5A,B |
| | Sn-98Pb | 316 | 322 | H2A |

FIG. 24B

| Sn-Pb-Bi SERIES | Sn-43Pb-14Bi | 135 | 165 | H43Bi14A |
| --- | --- | --- | --- | --- |
| Sn-Bi SERIES | Sn-58Bi | 139 | 139 | H42Bi58A |
| Sn-Pb-Ag SERIES | Sn-36Pb-2Ag | 179 | 190 | H62Ag2A |
| Sn-Ag SERIES | Sn-3,5Ag | 221 | 221 | H96Ag3.5A |
| Sn-Sb SERIES | Sn-5Sb | 235 | 240 | H95Sb5A |
| Pb-Ag SERIES | Pb-2.5Ag | 304 | 304 | HAg2.5A |
| Pb-Ag-Sn SERIES | Pb-1.5Ag-1Sn | 309 | 309 | H1Ag1.5A |

S, A, B, OF JIS SIMBOLS REPRESENT GRADES.

MOUNTING PARTS PEEL SUPPRESSING SOLDERING METHOD, ELECTRONIC CIRCUIT BASEBOARD, AND ELECTRONIC INSTRUMENT

CROSS-REFERENCE TO RELATED APPLICATIONS

This application claims priority under 35 USC §119 to Japanese Patent Application No. 2001-132295 filed on Apr. 27, 2001, the entire contents of which are incorporated herein by reference.

BACKGROUND OF THE INVENTION

1. Field of the Invention

The present invention relates to soldering technology that performs reflow and flow soldering to both side surfaces, respectively, of a baseboard with a lead-free solder alloy, and more particularly, to a method capable of suppressing peeling of a reflow soldering section when flow soldering is performed, in an electronic circuit baseboard, and an electronic instrument.

2. Description of the Related Art

In the past, a Sn—Pb (tin-lead) type solder, including a large quantity of Pb (lead), is generally utilized when electronic parts are mounted. However, when a circuit baseboard is soldered with an Sn—Pb type solder and the lead is discarded, the solder sometimes fuses out therefrom, giving undesirable effects to an ecological system and thereby causing environmental pollution. As a result, usage of a Pb-free type solder alloy is highly desirable.

After investigations of various Pb-free solder alloys; three components such as an Sn—Ag—Bi (tin-silver-bismuth) based material is a prevailing candidate for a Pb-free type solder alloy rather than an Sn—Pb type solder.

The reason is that various compositions formed by a two component type solder alloy have already been examined as Pb-free solder alternatives. For example, since Sn-3.5 weight % Ag has a fusing point of 221° C. and Sn-5 weight % Sb (antimony) has a fusing point of 199° C., respectively, these fusing points are too high in comparison to the Sn-37 weight % Pb solder alloy. The Sn-37 weight % Pb has a fusing point of 183° C. Accordingly, these two component type materials are not employed as Pb-free solders for a conventional glass epoxy baseboard.

In addition, even though Sn-9 weight % Zn (zinc) has a low fusing point of 199° C., the solder's surface is easily oxidized. The solder's surfaces wetting performance, with regard to an electrode comprising Cu (copper) or Ni (nickel), is particularly lower in comparison to that of an Sn—Ag or Sn—Sb type solder. As a result, Sn-9 weight % Zn is not employed either as a Pb-free type solder. Furthermore, since Sn-58 weight % Bi has a fusing point of 138° C. and is hard and brittle, this two component type alloy has problems associated with its structural integrity and is thus, difficult to employ.

Sn-52 weight % In (indium) also has a lower fusing point of 117° C. than Sn-37 weight % Pb which has a fusing point of 183° C. This difference in fusing point temperatures causes an additional problem of a weakening intensity in the solder connection section at high temperatures. In contrast, the fusing point can be approximated more closely to 183° C. (e.g., the fusing point of Sn-37 weight % Pb,) when a three component type Pb-free alloy, such as Sn—Ag—Bi is employed, as compared to when a two component type Pb-free alloy is employed.

However, when seeking prescribed materials whose fusing points approximate to 183° C., in the three component type Pb-free alloy, a perfect eutectic composition is not obtained. A composition should have a solid and liquid coexisting temperature (e.g., a solid phase line temperature lower than 183° C. and a liquid phase line temperature higher than 183° C.).

Thus, when a flow soldering process is performed after parts are connected by a reflow soldering process, and air cooling is performed without a blower for the baseboard, the respective temperatures decline at different rates in these added parts and the baseboard. As a result, a large temperature difference arises in the solder of the connecting sections since the connected parts have different heat capacities from that of the glass epoxy baseboard. In these situations, when a solder is utilized having a wide temperature range of a solid and liquid coexistence, the solder coagulates, because a phase having a low fusing point (e.g., a hard and brittle phase largely including Bi) is segregated at a higher temperature side. As a result, the connecting intensity of various parts that complete the segregation phase after receiving a reflow soldering process is readily weakened.

Current technology relating to a Pb-free type solder alloy such as Bi (bismuth) is disclosed in Japanese Patent Application No. 11-221694. This application refers to a reflow soldering process performed on both surfaces of an organic baseboard with a Pb-free type solder, that includes Sn as a principal component together with 0~3.0 weight % Bi, 0.5~4.0 weight % Ag, and a total 0~3.0 weight % Cu and/or In. Japanese Patent Application No. 2001-36233 discloses technology capable of avoiding a temperature difference connecting a section through a soldering process by employing a heat conductive material between the baseboard and the parts body.

Specifically, to resolve the above-mentioned problems, a three component type alloy such as Sn—Ag—Cu as a Pb-free solder alloy is desirable. This three component type alloy has a high fusing point, an inferior wetting performance, and superior connecting structural integrity after soldering processes. As a result, the use of Sn—Ag—Cu as a Pb-free solder alloy has received much attention. FIGS. 23A–C are charts illustrating various types of Pb-free solders with varying characteristics, such as fusing points, machine performance, wetting performance, oxidizing performance, processing performance, and cost. FIGS. 24A–B are charts illustrating typical types of solder alloys and their respective fusing points, such as their solid and liquid phase line temperatures.

However, it has been discovered that even when using Sn—Ag—Cu, which is believed to have good structural integrity, the segregation of Pb included in a parts lead terminal frame as illustrated in FIG. 21, arises when a flow soldering process is performed with a flow solder on the second side surface after a reflow soldering process on the first surface is performed. As a result, peeling off arises in the soldering section as illustrated in FIG. 22.

The peeling off phenomenon occurs because the temperature of the reflow soldering section approaches the fusing point of the solder alloy of the soldering section (i.e., between the solid and liquid phase line temperatures) due to heat conducted from the second side when a flow soldering process is performed.

To avoid this problem, it is desirable that the temperature of the soldering section is not raised to the solid phase line level of the fusing alloy. Particularly, the reflow soldering section is controlled so it does not fuse again. It is desirable that a eutectic crystal composition is utilized which will not cause the segregation of a low fusing point component even when an alloy fuses. It is also desirable to obtain a liquid phase line temperature that exceeds the high fusing point alloy temperature and makes the alloy coagulate again through cooling so that the segregation of the low fusing component does not occur even when the alloy fuses. In addition, it is desirable to perform a cooling process so that a temperature difference does not occur in the soldering section during a coagulation process when an alloy fuses.

SUMMARY OF THE INVENTION

Accordingly, an object of the present invention is to resolve the above noted problems and provide a new mounting parts peel suppressing system. The present invention provides a novel soldering method including the steps of performing a reflow soldering process on one side surface of a baseboard, performing a flow soldering process while contacting the jet flow solder to the other side surface of the baseboard, producing alloys in soldering sections when reflow and flow soldering processes are performed, and differentiating a composition point or a fusing point of each of the alloys employed.

In one embodiment, the reflow soldering process uses a solder material comprising Sn—Pb eutectic as a base and is obtained by blending compositions, and the flow soldering process uses a Pb-free composition that has a fusing point ranging from about 175° C. to about 185° C.

In another embodiment, the reflow soldering material comprises Sn—Ag—Cu.

In another embodiment, the reflow soldering material does not comprise Pb, and the flow soldering material comprises a Sn—Pb eutectic as a base, and is obtained by blending compositions that have fusing points ranging from about 175° C. to about 185° C.

In another embodiment, the flow soldering material comprises Sn—Ag—Cu.

In another embodiment, a soldering method further comprises the step of controlling the temperature of a reflow soldering section so that it does not reach a solid phase line temperature lower than the low fusing point alloy's temperature during a flow soldering process.

In another embodiment, a heat insulating member is provided on the flow soldering surface.

In another embodiment, a heat insulating member is provided on a portion other than a soldering target region of the flow soldering surface.

In yet another embodiment, a heat insulating member is provided in a portion that corresponds to a reflow soldering target region of the reflow soldering surface.

In yet another embodiment, a cover is provided to avoid solder from contacting a portion other than a soldering target region of the flow soldering surface.

In another embodiment, a heat releasing member is provided on a reflow soldering target region of the reflow soldering surface.

In another embodiment, the reflow or flow soldering surfaces respective sides are subsequently cooled after a flow soldering process.

In another embodiment, the jet flow solder avoids contacting a portion other than the soldering target region of the flow soldering surface.

In another embodiment, the baseboard is separated to flow and reflow soldering target regions.

In another embodiment, a soldering method using Pb-free material further comprises controlling a temperature of a reflow soldering section that exceeds a liquid phase line temperature which is higher than a high fusing point alloy's temperature during the flow soldering process.

In another embodiment, a heating device is provided near the reflow soldering surface.

BRIEF DESCRIPTION OF THE DRAWINGS

A more complete appreciation of the present invention and many of the attendant advantages thereof will be better understood by reference to the following detailed description when considered in connection with the accompanying drawings.

FIGS. 4A1, 4A2, 4B illustrates respective conditions after pre-heating the baseboard and conditions before and after a flow soldering process with jet flow is performed;

FIG. 21 illustrates the segregation of Pb included in a parts lead terminal frame or the like;

FIGS. 23A, 23B, 23C are charts illustrating various types and characteristics of Pb-free type solders; and, FIGS. 24A, 24B are charts illustrating various types and fusing points of typical solder alloys.

DETAILED DESCRIPTION

Figure 1:
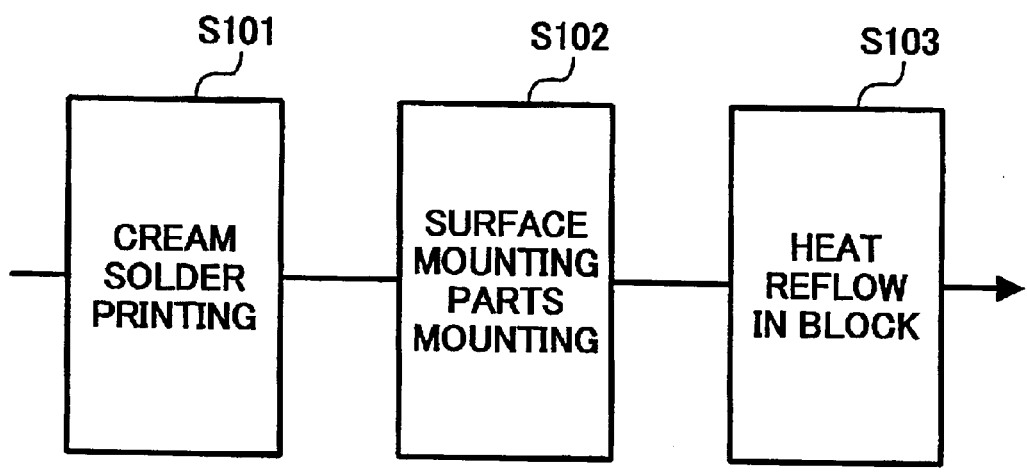
FIG. 1 is a flowchart illustrating a reflow soldering method used when parts mounting is performed on a print circuit baseboard.

Refer now to the drawings, wherein like reference numerals and marks designate identical or corresponding parts throughout the drawings and detailed descriptions. Various methods for mounting and loading mixed parts on a print circuit baseboard are currently utilized and can be sorted into four different methods.

The first method performs a reflow soldering process on only one side surface of a print circuit baseboard. The second method performs a reflow soldering process on both side surfaces of a print circuit baseboard. The third method performs a flow soldering process on only one side surface. The fourth method performs reflow and flow soldering processes on both side surfaces.

A method for mounting parts on a print circuit baseboard in accordance with the present invention may employ the fourth method of soldering mentioned above.

Figure 2A:
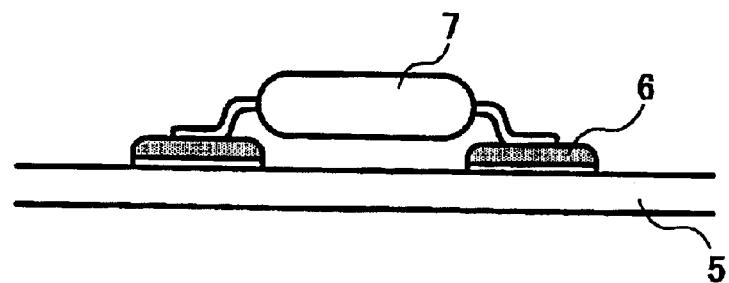
FIGS. 2A, 2B illustrates respective conditions after electronic parts mounting and reflow soldering occurs.
Figure 2B:
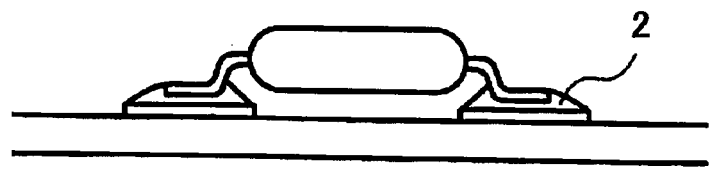
Figure 3:
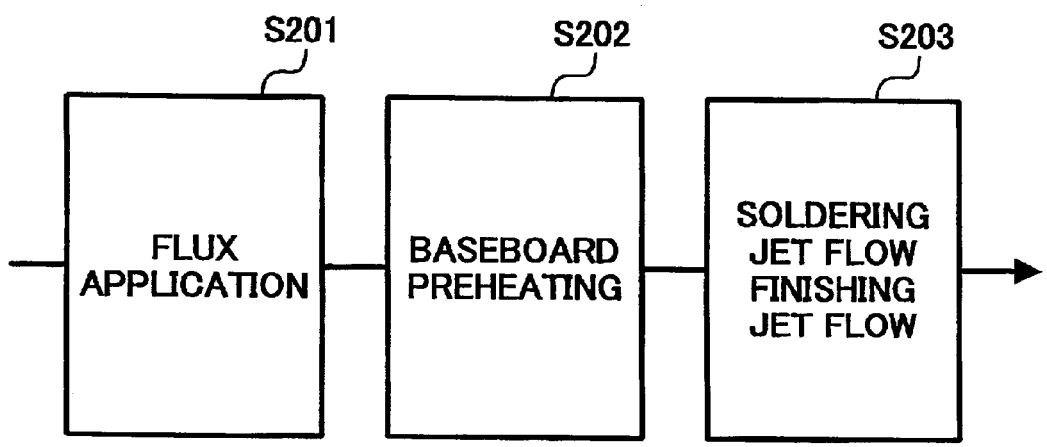
FIG. 3 is a flowchart illustrating a flow soldering method used when parts mounting is performed on a print circuit baseboard.

FIG. 1 is a flowchart illustrating a reflow soldering process performed when a print circuit baseboard mounts parts. FIG. 2A illustrates a condition after electronic parts are mounted on a print circuit baseboard. FIG. 2B illustrates a condition after a reflow soldering process is performed. FIG. 3 is a flowchart illustrating a flow soldering method using a jet flow when a print circuit baseboard mounts parts. FIG. 4A1 illustrates a condition after pre-heating a baseboard. FIG. 4A2 illustrates a condition before a flow soldering process is performed. FIG. 4B illustrates a condition after a flow soldering process is performed.

A process for mounting parts on a print circuit baseboard according to the present invention is now described in reference to FIGS. 1–4. In a reflow soldering process, cream solder 6 may be initially printed on a baseboard 5 as illustrated in FIG. 1 (step S101). Various surface mounting parts 7 can then be mounted as illustrated in FIG. 2A (step S102). Soldering may then be performed in a block while heating with an infrared light heater or by blowing hot air as illustrated in FIG. 2B (in step S103).

After performing a reflow soldering process to one side surface of the baseboard 5 as mentioned above, the baseboard 5 may then be turned over and an adhesive agent 24 is coated so that surface mounting parts 7 are secured. A flow soldering surface mounting parts 8 may then be loaded and the adhesive agent 24 may be hardened. Next, the baseboard can then be turned over again and lead soldering parts 9 may be inserted. Then, flux may be coated on the backside of the baseboard in step S201 as illustrated in FIG. 3. The baseboard may then be pre-heated (in step S202) and jet flows 10 and 11, comprising a molten solder, make contact to the backside, and thereby soldering processes with a soldering flow and a finishing flow, as shown in step S203 of FIGS. 3 and 4B, are performed. Thus, a reflow and flow soldering process can be performed on both the front and backsides of the baseboard.

A flow soldering temperature is set from about 240° C. to about 260° C. in accordance with the employing alloy. However, since the soldering process is performed in direct contact with the baseboard 5 to fusing and jet flowing solders (10 and 11), the temperature of a reflow soldering section of the reflow soldering surface can increase due to the conduction of heat from the jet flow solder (10 and 11) via baseboard 5 of the print circuit baseboard 12 as illustrated in FIGS. 1–4.

Figure 21:
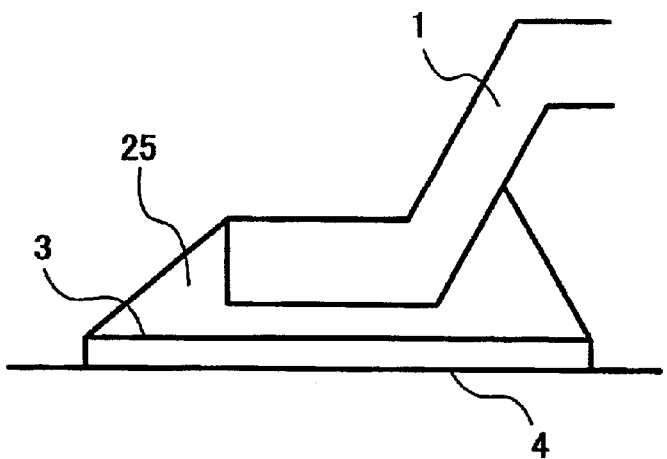
Figure 22:
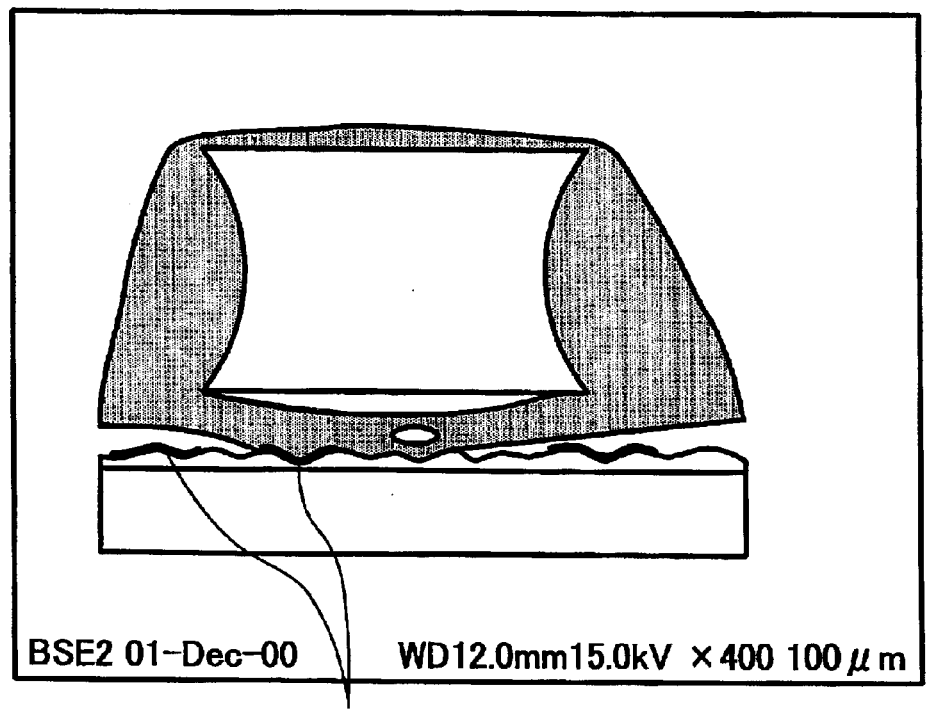
FIG. 22 illustrates a condition when peeling is present in a soldering section.

When a Pb-free solder material is utilized, an alloy produced in a reflow soldering section can generate a segregation phase of a low fusing point component, as FIG. 21 illustrates, and peeling off can occur as FIG. 22 illustrates. This depends upon the combination of soldering materials, parts, and baseboard side terminal materials utilized. This phenomenon, however, does not always appear when conventional eutectic crystal compositions such as a Sn-37 weight % Pb enabling solder to immediately coagulate is utilized.

Figure 20:
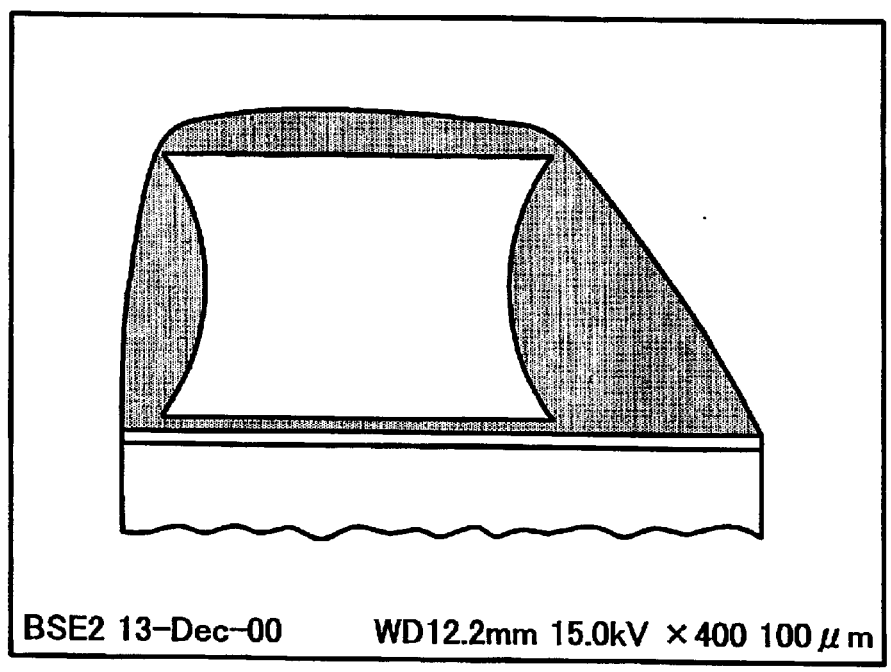
FIG. 20 illustrates a condition when no peeling appears in a soldering section.

To suppress the segregation phase and maintain structural integrity of a connecting section even when a Pb-free type solder is required, the below described soldering method for soldering a reflow soldering section 2 are effective. If soldering is performed according to the methods of this invention, a reflow soldering section can hardly be peeled off as illustrated in FIG. 20.

First, a temperature is controlled so that it does not rise up to a solid phase line temperature that allows the alloy to fuse. Second, even if the alloy fuses, a eutectic composition that does not generate the segregation phase of a low fusing point component is utilized as the solder. Third, a liquid phase line temperature that is greater than a high fusing point alloy's temperature is applied to prevent a low fusing point component from entering a segregation phase even if the alloy fuses. The alloy is then cooled and coagulates again. Finally, the alloy is cooled so that temperature differences do not appear in the soldering section.

Figure 5:
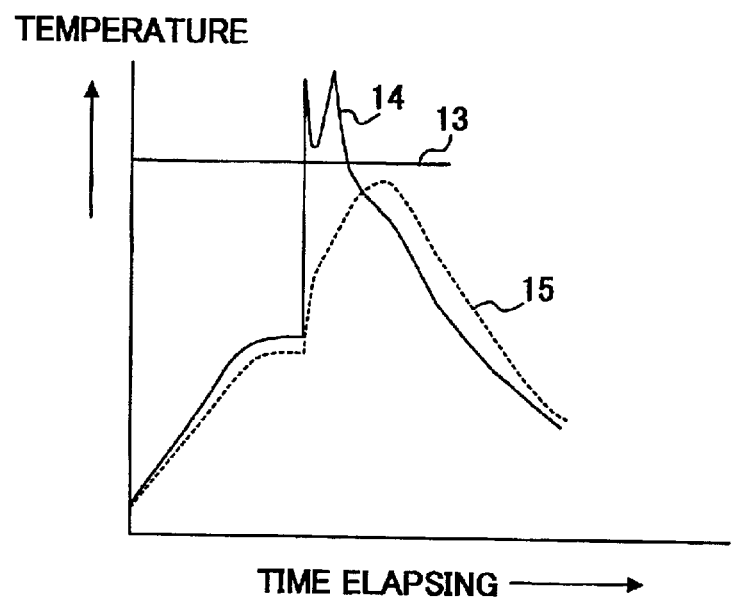
FIG. 5 is a chart illustrating a profile that appears when a flow soldering process is performed at a temperature where the reflow soldering section does not reach an alloy's fusing point.
Figure 6:
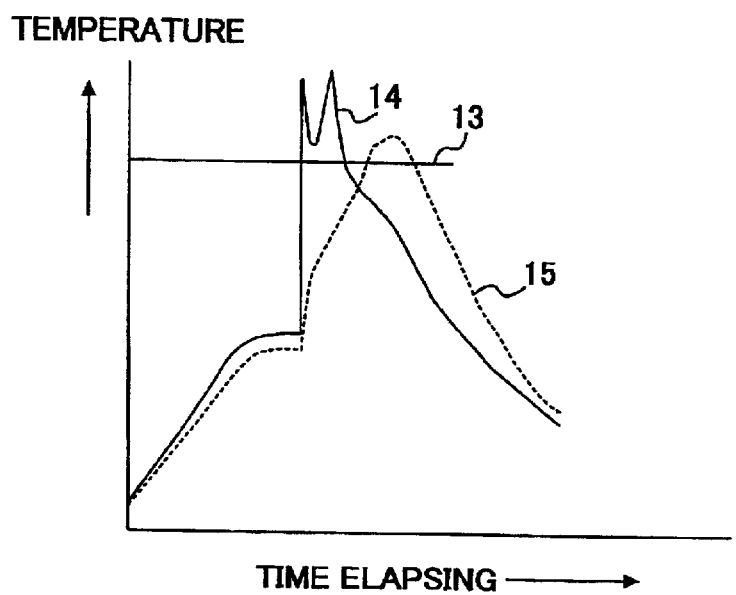
FIG. 6 is a chart illustrating a profile that appears when a flow soldering process is performed at a temperature where the reflow soldering section exceeds an alloy's fusing point.

The first embodiment is now described with reference to several drawings. FIG. 5 is a chart illustrating a profile of the temperature of a reflow soldering section 2 that does not reach an alloy's fusing point during a flow soldering process. FIG. 6 is a chart illustrating a profile of the temperature of a reflow soldering section 2 exceeding an alloy's fusing point during a flow soldering process.

Figure 23C:
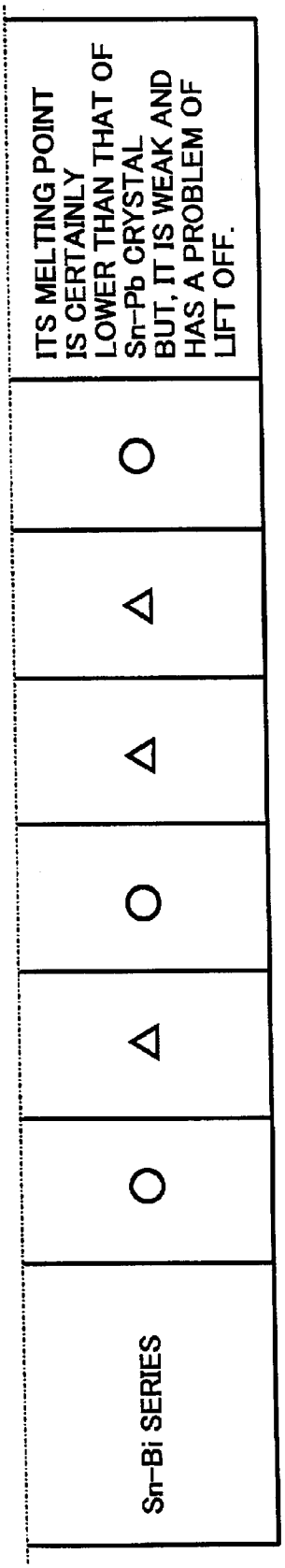

If a solder alloy is utilized when various electronic parts are mounted, a Sn—Pb type solder largely including Pb can be employed. However, this Sn—Pb type solder results in the fusion of Pb from a circuit baseboard that is discarded. Undesirable effects to the ecology and environmental pollution can result from the fusion of Pb. As a result, a Pb-free type solder alloy is desired. Various types and characteristics of Pb-free soldering materials have been evaluated in detail and are well-known in the prior art as FIG. 23 illustrates. However, due to variations in the composition and variety of materials, decreasing the amount of Pb from surface treatment materials, such as gilt for parts and baseboard materials, have not been advanced. Specifically, mixed loading with Pb-containing material will unavoidably continue for a while. If Pb is included in the gilt of a parts terminal frame, the reflow soldering section 2 peels off during a soldering process as described earlier.

When a print circuit baseboard mounts parts by a soldering process, it is difficult to achieve perfect Pb-free soldering materials without a great deal of cost. One countermeasure capable of decreasing the amount of Pb is employing a eutectic composition that includes Pb in a reflow soldering section or the amount of Pb used in a mounting process is decreased so as to reduce the peeling off phenomenon and to obtain a higher and more credible solder connecting performance. In addition, no problems exist when materials excluding Pb are used in the gilt of a parts terminal frame.

The temperature of a reflow soldering section 2 can range from approximately 180° C. to approximately 190° C. when a flow soldering process is performed with a jet flow solder whose temperature is approximately 250° C. These are standard conditions for obtaining a fusing point of 183° C. for a Sn-37 weight % Pb eutectic crystal. However, by lowering the jet flow solder's temperature to approximately 230° C., a soldering process can then be performed without any problems, even though the wetting and expanding performance is slightly lowered. In this situation, the temperature of a reflow soldering section 2 can be lowered by approximately 20° C. to approximately 160° C. to approximately 170° C. in comparison to when the jet flow solder's temperature is 250° C. and that of the reflow soldering section's temperature 2 is from approximately 180° C. to approximately 190° C.

The fusing point of a Pb-free soldering alloy such as Sn—Ag—Cu can be 217° C. (i.e., the fusing point of the eutectic crystal). The flow soldering process temperature can also be desirably raised up to 280° C. However, when elements such as the heat-resistance of parts, the increase in the amount of generated oxidization residue, and the durability of the apparatus are considered, the flow soldering temperature is appropriate if it is suppressed to approximately 260° C. In this situation, a temperature of the reflow soldering section 2 can rise by approximately 100° C. to 190° C. up to 200° C. in comparison to that when the reflow soldering section's temperature is from 180° C. to 190° C. and the jet flow solder's temperature is 250° C.

If Sn-37 weight % Pb is utilized as the flow soldering material, the temperature of the reflow soldering section 2 can be approximately 160° C. to approximately 170° C. Accordingly, since the alloy of the reflow soldering section 2 does not arrive at the alloy's fusing point of 179° C. of the Sn—Ag—Pb combination, even if the alloy includes some Pb of the gilt, peeling off of the reflow soldering section 2 can be avoided.

If Sn—Ag—Cu (tin-silver-copper) is utilized as the flow solder material, the temperature of the reflow soldering section 2 can be approximately 190° C. to approximately 200° C. Accordingly, since the alloy of the reflow soldering section exceeds the alloy's fusing point of 183° C. of an Sn—Pb combination and re-diffuses, peeling off of the reflow soldering section 2 can be avoided.

It is preferred that a Pb-free type solder is employed in reflow and flow soldering processes. However, since a current status is a transit period and electrode material including Pb is utilized for a lead terminal frame of parts, a peeling off phenomenon occurs due to the segregation caused by the re-fusing of the lead. As a solution, soldering materials made of various blended compositions, comprising Sn—Pb eutectic crystal as a base, and possessing fusing points of approximately 175° C. to approximately 185° C. can therefore be utilized. For example, a solder including Sn-37 weight % Pb that has a fusing point of 183° C. or Sn—Pb—0.4 weight % Ag that has a fusing point of 179° C. to 183° C. (i.e., both solid and liquid phase lines) can then be employed. In addition, if exploiting the conventional construction method having a practical record, one side surface of the print circuit baseboard can be Pb-free.

The above example is described when both reflow and flow solder materials include Pb. However, when a Pb-free type solder material is utilized, the peeling off of a reflow soldering section 2 can be avoided if the material's property is carefully evaluated and selectively used. Specifically, respective fusing points or compositions of reflow and flow soldering alloys can be differentiated from each other when the temperature of a flow solder is controlled as described above, and a material that has a eutectic fusing point is utilized.

Figure 7:
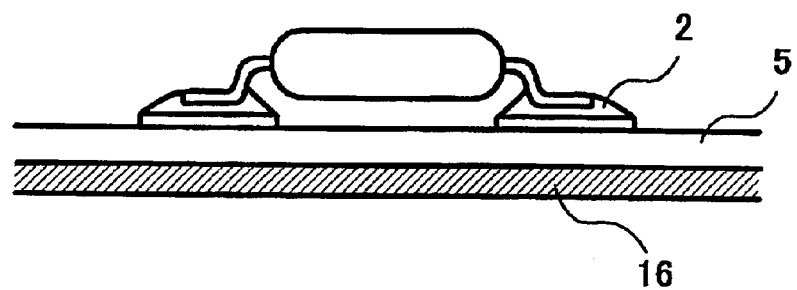
FIG. 7 illustrates an example of providing a heat insulating member on a flow soldering surface's side.
Figure 8:
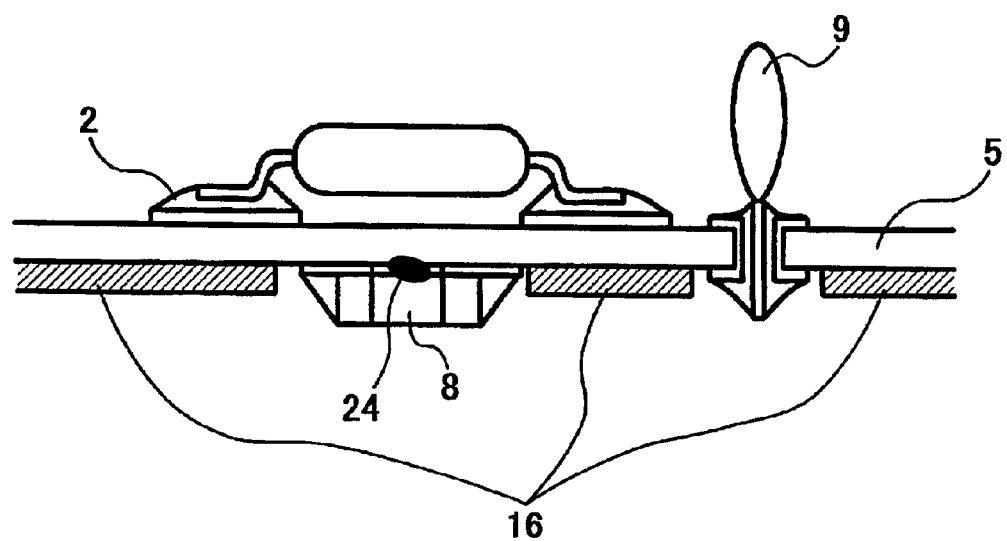
FIG. 8 illustrates an example of providing a heat insulating member in a portion other than a solder target region.
Figure 9:
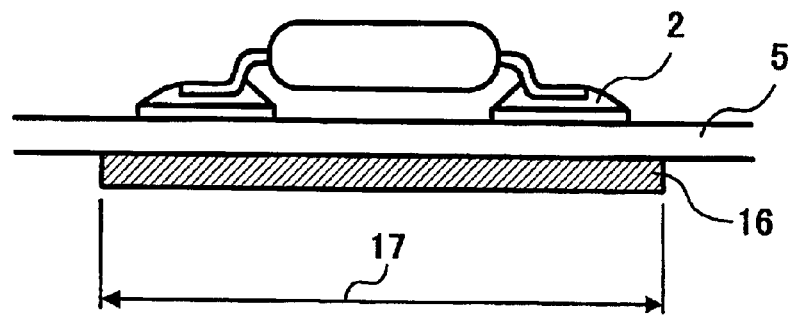
FIG. 9 illustrates an example of providing a heat insulating member in a solder target region on a reflow soldering surface.

Various embodiments are described below with reference to several drawings. FIG. 7 illustrates an embodiment with a heat insulation effect member provided on a flow soldering surface. FIG. 8 illustrates a different embodiment when a heat insulation effect member is provided in a region other than a soldering receiving region. FIG. 9 illustrates an embodiment of a heat insulation effect member provided within a region corresponding to a reflow soldering surface.

Figure 10:
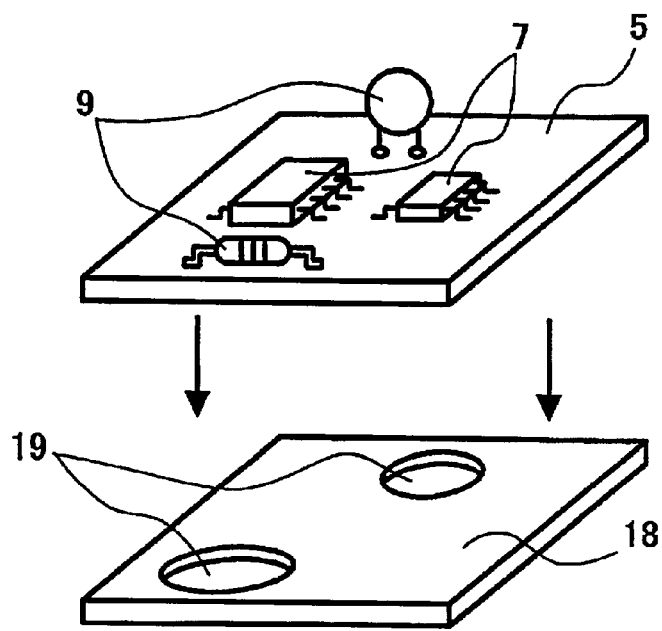
FIG. 10 illustrates an example of providing a cover that prevents solder from contacting a portion other than a solder target region.
Figure 11:
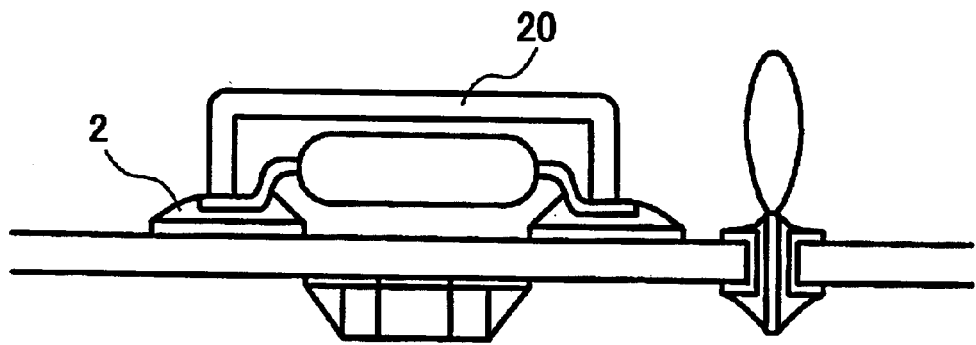
FIG. 11 illustrates an example of providing a heat releasing member in a target region on a reflow soldering surface.

FIG. 10 illustrates an embodiment of a cover disabling solder that contacts a solder receiving region of the flow soldering receiving side. FIG. 11 illustrates an embodiment of a heat release effect member provided within a target region of the reflow soldering surface side.

Figure 12:
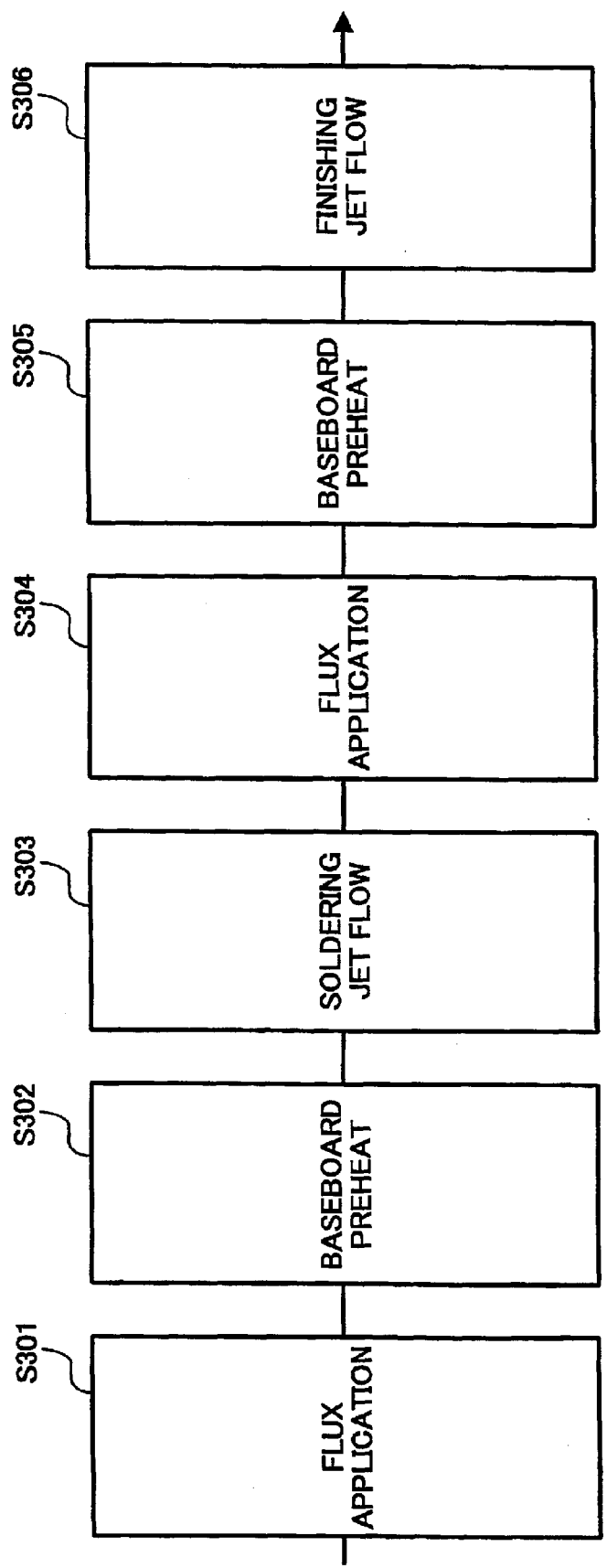
FIG. 12 is a flowchart illustrating a flow soldering process with jet flow that is divided into two steps.
Figure 13:
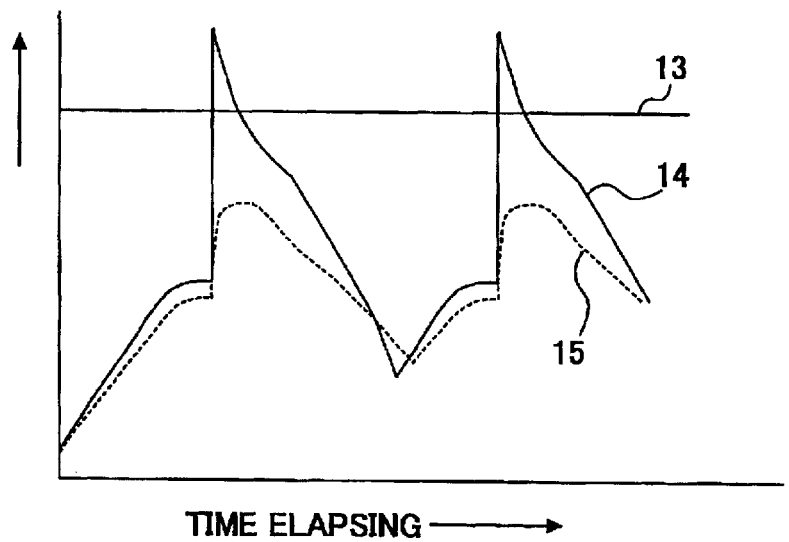
FIG. 13 is a chart illustrating a profile when the lead temperature of a reflow soldering section does not reach an alloy's fusing point during a flow soldering process with jet flow that is divided into two steps.
Figure 14:
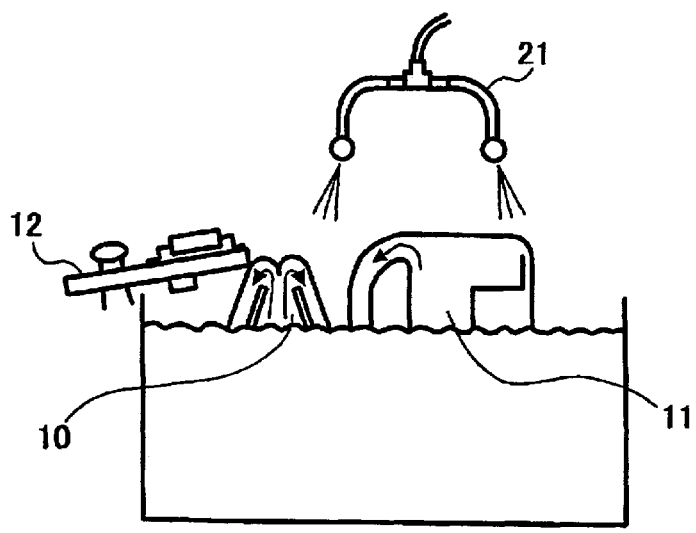
FIG. 14 illustrates a cooling apparatus that cools a reflow soldering surface just after a flow soldering process is performed.
Figure 15:
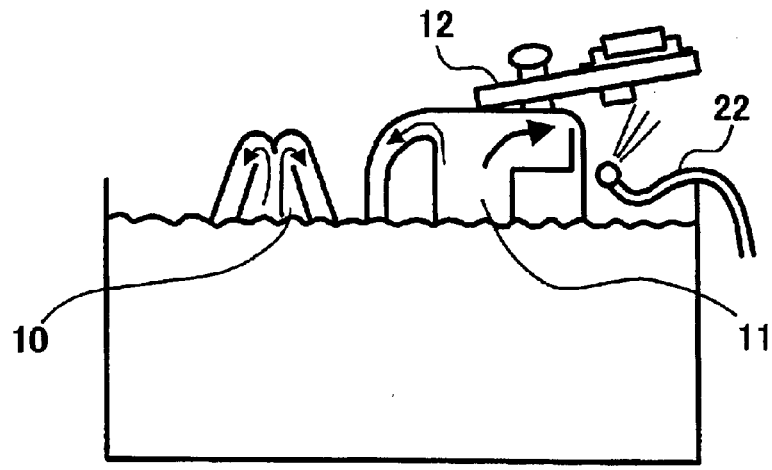
FIG. 15 illustrates a cooling apparatus that cools a flow soldering surface after a flow soldering process is performed.

FIG. 12 is a flowchart illustrating a flow soldering process when a jet flow soldering process is divided into two steps. FIG. 13 is a chart illustrating a profile that appears when a divided jet flow solder process is performed and the lead temperature of a reflow erering section does not reach an alloy's fusing point. FIG. 14 illustrates an embodiment of a cooling apparatus provided on a reflow soldering surface side after a flow soldering process is performed. FIG. 15 illustrates an embodiment of a cooling apparatus provided in a flow soldering surface side after a flow soldering process is performed.

Figure 16:
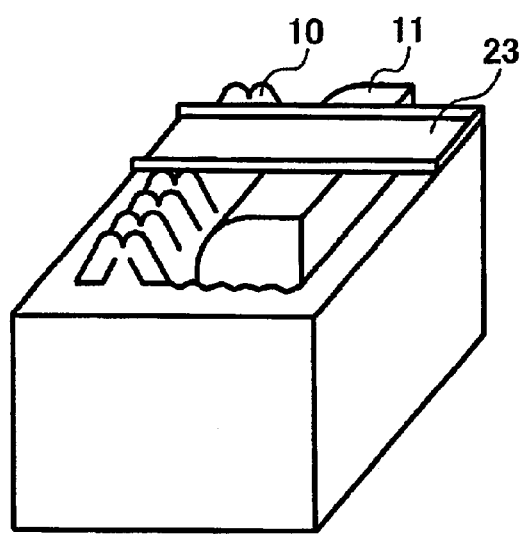
FIG. 16 illustrates the configuration of a cover provided in a target region of the flow soldering surface preventing the solder from contacting it.
Figure 17:
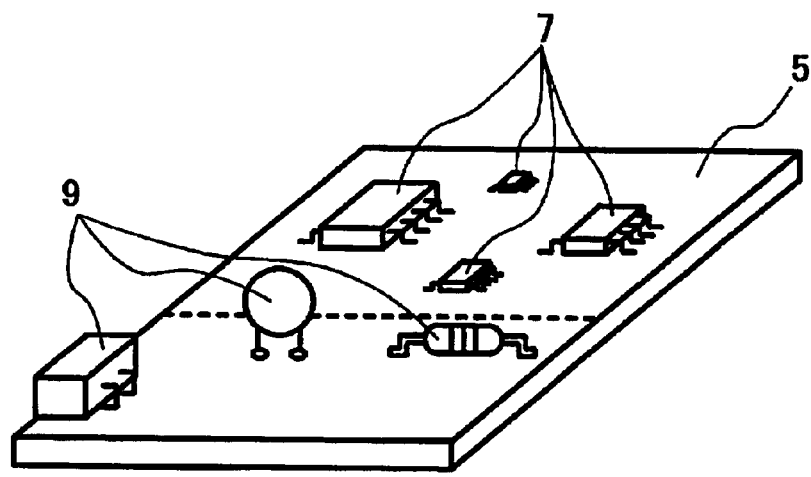
FIG. 17 illustrates a print circuit baseboard in which respective target regions for flow and reflow soldering processes are separated from each other.

FIG. 16 illustrates an embodiment of a construction disabling solder that contacts a target region of a flow soldering surface. FIG. 17 illustrates an embodiment of a print circuit baseboard whose target regions of flow and reflow soldering surfaces are separate.

These various embodiments are now described below in more detail. When a print circuit baseboard 12 mounts various parts, reflow and flow soldering processes can be performed to both side surfaces thereof, with a Pb-free solder material. In order to enable a reflow soldering section to avoid peeling, the temperature of the reflow soldering section 2 can be controlled so that it does not reach a solid phase line temperature less than a low fusing point alloy's temperature during a flow soldering process. The previously described combination of alloys can achieve such avoidance. However, the following embodiments propose different soldering methods.

In order to avoid direct transfer of heat from a jet flow solder to a flow soldering surface when a flow soldering process is performed by contacting the jet flow solder as illustrated in FIG. 7, a heat insulating member 16 such as heat resistant plastic can be employed on the flow surface side. In this embodiment, the heat transfer from a baseboard surface contacting the solder to the reflow soldering section 2 can be suppressed. Accordingly, an increase in the temperature of the reflow soldering section 2 can be suppressed and an alloy's fusing point is not reached. As a result, peeling off of the soldering section is suppressed. A heat insulating member 16 can be one capable of suppressing an increase in temperature that is transferred to the reflow soldering section from the baseboard contacting the jet flow solder.

Refer now to FIG. 8, wherein a similar embodiment to the one described above can also be employed. This occurs since there exist soldering target regions mounting flow solder side surface mounting parts 8 and lead terminal soldering parts 9, respectively fixed by hardening adhesive agent 24 to the print circuit baseboard 12. The heat insulating member 16, such as a heat resistant plastic, can be provided by avoiding these regions when a jet flow solder process is performed.

Furthermore, during a reflow soldering process as illustrated in FIGS. 1 and 2, the heat insulating member 16 can be formed either by a coating thereof, similar to cream solder 6 (e.g., a coating adhesive agent with a dispenser) or by providing a sheet-like member that has a chop-off section and adhesive material. Thus, since the heat insulating member 16 is substantially entirely provided on the flow solder surface, uniformly, the temperature of the reflow soldering section 2 can be suppressed so as to not reach an alloy's fusing point. As a result, peeling of the reflow soldering section may be suppressed.

The embodiment illustrated in FIG. 9 is now described in detail. A soldering method can be similar to that in the above-described embodiment. Since peeling arises as described above, a soldering target region 17 whose temperature should be lower than a fusing point, can be defined on a flow solder surface that corresponds to parts mounted on the reflow soldering surface. Then, the heat insulating member 16, such as a heat insulating plastic, can then be provided in the soldering target region 17. Thus, by providing only an appropriate section with the heat insulating member 16, the temperature increase of the reflow soldering section 2 can be efficiently suppressed and the alloy's fusing point is not reached. As a result, peeling of the reflow soldering section 2 can be suppressed or avoided.

The embodiment of FIG. 10 is now described in more detail. As noted, when soldering with a jet flow solder process, a heat insulating cover 18 can be employed. The heat insulating cover 18 can include openings 19 at a position that corresponds to a soldering target of the lead terminal soldering parts 9 mounted on the print baseboard 5. The soldering target can fit into the cut away holes 19. Then, a soldering process can be performed through the opening 19. In addition, since the reflow soldering section 2 is heat insulated by means of the heat insulating member 18, an increase in the temperature is suppressed and the alloy's fusing point is not reached. As a result, peeling of the reflow soldering section can be avoided.

The embodiment of FIG. 11 is now described. A heat releasing member 20, such as a metal heat releasing cover, can be provided to contact a reflow soldering section 2 whose temperature rises due to heat transfer caused when a soldering process is performed while jet flow contacts the baseboard 5. Thus, an increase in the temperature of the reflow soldering section 2 can be suppressed by the heat releasing performed by the heat releasing member 20. As a result, substantially the same effect as mentioned above can be obtained.

Another embodiment illustrated by FIG. 12 is now described. As noted, a jet flow solder process of a flow soldering section can be separately performed in two steps (i.e., a jet flow soldering process and a jet flow finishing process so as to not continuously transfer heat to a reflow soldering section 2). As shown in step s203 in soldering flowchart FIG. 3, since the soldering and finishing jet flow processes are continuously performed in one step, the temperature increases due to continuous heat transfer to the reflow soldering section 2.

In contrast, as shown in flowchart FIG. 12, the soldering jet flow process can be divided into two steps, i.e., a first soldering jet flow process in step S303 and a second finishing jet flow process in step S306, and the respective jet flow processes are not continuously blown to the flow soldering section 2. Thus, a temperature profile illustrated in FIG. 13 may be obtained, and accordingly, substantially the same effect as mentioned above can be obtained.

Additional embodiments are now described in reference to several drawings. As FIGS. 5 and 6 illustrate, when soldering is performed with a jet flow process, a temperature profile 15 of the reflow soldering section 2 can have a peak at a slightly delayed timing by a time period taken by heat transfer when compared with that of a flow soldering surface baseboard temperature profile 14. From this phenomenon, it is apparent that the peak of the temperature of a reflow soldering section 2 delays from just after a flow soldering process is performed.

Then, a reflow soldering surface side cooling apparatus 21 can be provided at a position, i.e., timing, just after a flow soldering process to blow air that has a cooling effect and suppresses the temperature of the reflow soldering surface below the fusing point as illustrated in FIG. 14. Thus, the flow soldering process is not interfered with, and substantially the same effect as mentioned above can be obtained.

Another embodiment is illustrated in FIG. 15. A flow soldering surface side cooling apparatus 22 can be provided to cool the flow soldering surface. Since the baseboard is cooled from the flow soldering surface side where the temperature can possibly increase greatly, the respective temperatures of the flow and reflow soldering sections 2 can be approximated to each other. As a result, the cooling efficiency is excellent and large stress is not generated in the print circuit baseboard. As a result, substantially the same effect as mentioned earlier can be obtained.

Another embodiment is illustrated in FIG. 16. A heat insulating cover 23 may be provided to selectively cover either the soldering or finishing jet flows 10 and 11. Thus, allowing at least one of the jet flows to contact an applicable flow soldering section. As a result, substantially the same effect as mentioned above can be obtained.

Another embodiment is illustrated in FIG. 17. A baseboard 5 is separated to a reflow soldering target region A, in which reflow soldering surface mounting parts 7 are soldered, and a flow soldering target region B, in which lead terminal soldering parts 9 and flow soldering side surface mounting parts 8 are soldered. Thus, substantially the same effect described earlier can be obtained.

Figure 18:
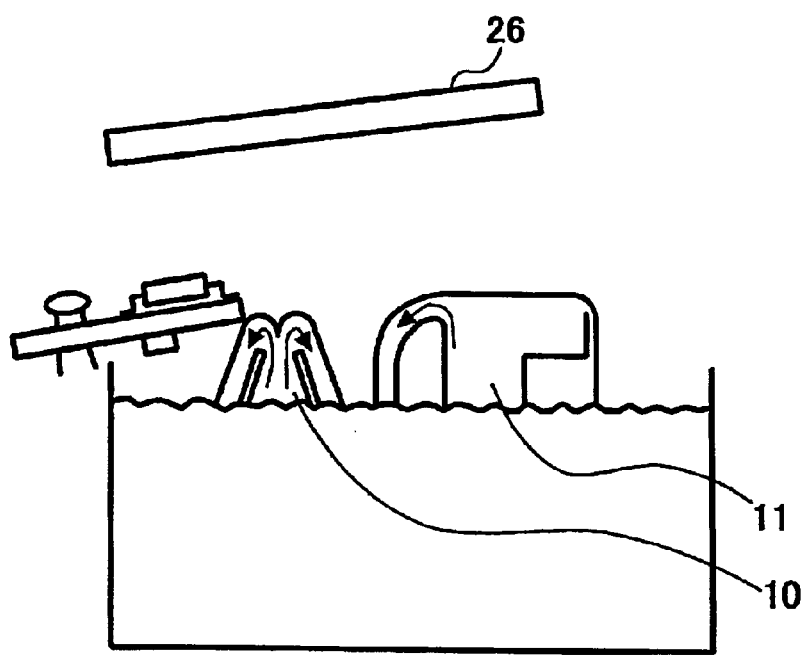
FIG. 18 illustrates a reflow soldering surface side heating apparatus.
Figure 19:
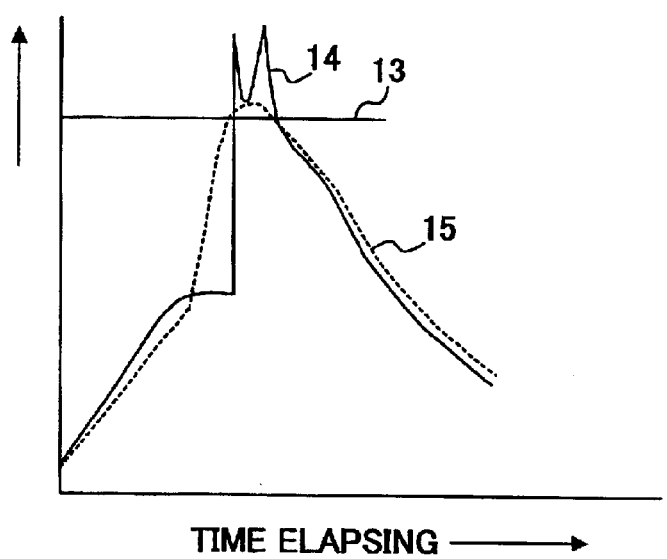
FIG. 19 is a chart illustrating a profile of a reflow soldering surface side heating apparatus.

Another embodiment is illustrated in FIGS. 18 and 19. FIG. 18 illustrates a reflow soldering surface side heating apparatus. FIG. 19 is a graph of the reflow soldering surface side heating apparatus.

Specifically, when mounting parts on a print circuit baseboard 12 using a Pb-free type solder material and performing reflow and flow soldering processes on both side surfaces, a temperature of the reflow soldering section 2 can be controlled to be a liquid phase line temperature that is higher than a high fusing point alloy's temperature when a flow soldering process is performed to enable the reflow soldering section 2 to avoid peeling. The above-described combination alloy, that has different components and fusing points, can achieve such avoidance. However, the following various embodiments propose different principles.

As FIG. 18 illustrates, a reflow soldering surface side heating apparatus 26 is provided above a flow soldering apparatus to apply heat with an infrared light heater or hot air. Then, the temperature of the reflow soldering section 2 can rise due to up and down side heaters (i.e., transfers heat from the flow soldering surface), and reflow soldering surface heat.

Thus, the liquid phase line temperature is higher than the high fusing point alloy's temperature and can be given so as to avoid the segregation of a low fusing point component. In addition, a temperature difference may not appear in the soldering section even when the alloy fuses and coagulates. Both temperature profiles of the flow soldering surface and the reflow soldering section 2 can be obtained as illustrated in FIG. 19. As a result, substantially the same effect as mentioned earlier can be obtained.

Still another embodiment is now described. Unless considering an alloy composition produced when lead terminal material (i.e., parts side terminal material) and baseboard side terminal material are combined together with soldering material as a target, a fine soldering condition may not be obtained. If a temperature of the reflow soldering section 2 is determined and set in view of a fusing point of such a combined alloy (i.e., a solid and liquid coexisting temperature intermediate the lower solid and higher liquid phase line temperatures) when the flow soldering is performed, the earlier described peeling is avoided.

Specifically, conventional Sn—Pb is still mainstream as gilt for a lead terminal section. However, Pb-free gilt is gradually replaced with Sn-2 weight % Bi gilt. As soldering material, a credible Pb-free solder of Sn—Ag—Cu type composition is obtained by blending Cu and an Sn—Ag type solder is now widely used. As a front surface of baseboard side terminal material, a Cu baseboard or Sn—Cu gilt is mainstream.

In the above-mentioned combination, the lowest solid phase line temperature is around 138° C. due to the combination of Bi (bismuth) of a parts terminal frame, soldering material, and baseboard material Sn. However, the parts side terminal material can currently comprise Sn-10 weight % Pb. In such situations, a fusing point of 179° C. appears as a solid phase line temperature obtained due to the combination of the soldering material Sn—Ag and the parts side terminal material Pb. The higher liquid phase line temperature is around 217° C. due to the combination of Sn, Ag, and Cu. By using the above-described combination and setting prescribed flow soldering conditions, soldering processes can be performed while avoiding a temperature of the reflow soldering section 2 to approximate around a fusing point of approximately 179° C. to approximately 217° C. As a result, substantially the same effect as described earlier can be obtained.

By using any of the above-mentioned soldering methods, an electronic circuit baseboard and a variety of electronic instruments can be obtained.

Numerous embodiments and variations of the present invention are possible in light of the above teachings. Therefore, it is to be understood that within the scope of the appended claims, the present invention can be practiced otherwise than as specifically described herein.

What is claimed as new and desired to be protected by Letters Patent of the United States is:

1. A method for soldering parts mounted on a baseboard, comprising the steps of:
   mounting parts on both side surfaces of the baseboard;
   performing reflow soldering to parts mounted on one side surface of the baseboard with a prescribed Pb excluding material alloy made of a Sn—Pb eutectic as a base; and
   performing flow soldering to parts mounted on another side surface of the baseboard with a prescribed jet flow solder alloy.

2. The method according to claim 1, wherein said prescribed Pb excluding material alloy has a melting point that is in the range from about 175° C. to about 185° C.

3. A method for soldering parts mounted on a baseboard, comprising the steps of:
   mounting parts on both side surfaces of the baseboard;
   performing reflow soldering to parts mounted on one side surface of the baseboard with a prescribed Pb excluding material alloy made of a Sn—Pb eutectic as a base;
   performing jet flow soldering to parts mounted on the other side surface of the baseboard with a prescribed jet flow solder alloy; and
   controlling a temperature of the Pb excluding material alloy on the one side surface not to reach a solid phase line temperature enabling the lower melting point alloy of said alloys to melt during the flow soldering.

4. The method according to claim 3, further comprising a step of providing a heat insulating member on the other side surface of the baseboard.

5. The method according to claim 4, wherein said step of providing the heat insulating member is performed by disposing the insulating member only on a portion corresponding to a soldering target of the one side surface.

6. The method according to claim 3, wherein said step of controlling a temperature is performed by providing a cover configured to avoid the solder from contacting a portion other than a soldering target of the other side surface.

7. The method according to claim 3, wherein said step of controlling a temperature is performed by providing a heat releasing member in a soldering target region of the one side surface.

8. The method according to claim 3, wherein said step of controlling a temperature is performed by cooling the one side surface just after the flow soldering is completed.

9. The method according to claim 3, wherein said step of controlling a temperature is performed by cooling the other side surface just after the flow soldering is completed.

10. The method according to claim 3, wherein said step of controlling a temperature is performed by dividing and separately performing the jet flow soldering to the other side surface.

11. A method for soldering parts mounted on a baseboard, comprising the steps of:
   mounting parts in first and second areas on one side surface of the baseboard;
   performing reflow soldering to parts mounted on the first area with a prescribed reflow solder alloy;
   performing flow soldering to parts mounted on the second area with a prescribed jet flow solder alloy; and
   differentiating either a composition or a melting point of the alloys so that the reflow solder alloy on the first area does not melt during the flow soldering to the second area.

12. A method for soldering parts mounted on a baseboard with Pb-free material, comprising the steps of:
   mounting parts on both side surfaces of the baseboard;
   performing reflow soldering to parts mounted on one side surface of the baseboard with a reflow solder alloy;
   performing flow soldering to parts mounted on the other side surface of the baseboard with a jet flow solder alloy; and
   controlling a temperature of the reflow solder alloy on the one side surface to exceed a liquid phase line temperature enabling a higher melting point alloy of said alloys to melt during the flow soldering.

13. The soldering method according to claim 12, wherein said step of controlling a temperature is performed by providing a heating device in the vicinity of a soldering target of the one side surface.

14. A method for soldering parts mounted on a baseboard, comprising the steps of:

mounting parts on both side surfaces of the baseboard;

performing reflow soldering to parts mounted on one side surface of the baseboard with a reflow solder alloy;

performing jet flow soldering to parts mounted on the other side surface of the baseboard with a jet flow solder alloy; and controlling a temperature of said reflow solder alloy on the one side surface not to reach a solid phase line temperature enabling the lower melting point alloy of said alloys to melt during the flow soldering, said step of controlling a temperature is performed by providing a cover configured to avoid the solder from contacting a portion other than a soldering target of the other side surface, said cover having at least one opening configured to allow the solder to contact the soldering target.

15. A method for soldering parts mounted on a baseboard, comprising the steps of:

mounting parts on both side surfaces of the baseboard;

performing reflow soldering to parts mounted on one side surface of the baseboard with a reflow solder alloy;

performing jet flow soldering to parts mounted on the other side surface of the baseboard with a jet flow solder alloy; and controlling a temperature of said reflow solder alloy on the one side surface not to reach a solid phase line temperature enabling the lower melting point alloy of said alloys to melt during the flow soldering, said step of controlling a temperature is performed by providing a heat releasing member in a soldering target region of the one side surface.

16. A method for soldering parts mounted on a baseboard, comprising the steps of:

mounting parts on both side surfaces of the baseboard;

performing reflow soldering to parts mounted on one side surface of the baseboard with a reflow solder alloy;

performing jet flow soldering to parts mounted on the other side surface of the baseboard with a jet flow solder alloy; and controlling a temperature of said reflow solder alloy on the one side surface not to reach a solid phase line temperature enabling the lower melting point alloy of said alloys to melt during the flow soldering, said step of controlling a temperature is performed by dividing and separately performing the jet flow soldering to the other side surface.

17. A method for soldering parts mourned on a baseboard, comprising the steps of:

mounting parts on both side surfaces of the baseboard;

performing reflow soldering to parts mounted on one side surface of the baseboard with a prescribed reflow solder alloy, said step of performing reflow soldering is performed using material made of Sn—Ag—Cu;

performing flow soldering to parts mounted on the other side surface of the baseboard with a prescribed jet flow solder alloy; and differentiating either a composition or a melting point of the alloys so that said reflow soldering alloy on the one side surface does not melt during the flow soldering to the other side surface.

18. A method for soldering parts mounted on a baseboard, comprising the steps of:

mounting parts on both side surfaces of the baseboard;

performing reflow soldering to parts mounted on one side surface of the baseboard with a prescribed reflow solder alloy;

performing flow soldering to parts mounted on the other side surface of the baseboard with a prescribed jet flow solder alloy, wherein said step of performing reflow soldering is performed with material excluding Pb, and said step of performing flow soldering is performed with material made of a Sn—Pb eutectic as a base and a composition having a melting point ranging from about 175° C. to about 185° C.; and differentiating either a composition or a melting point of the alloys so that said reflow solder alloy on the one side surface does not melt during the flow soldering to the other side surface.

* * * * *